(12) United States Patent
Ng et al.

(10) Patent No.: US 8,905,109 B2
(45) Date of Patent: Dec. 9, 2014

(54) APPARATUS FOR BONDING SUBSTRATES TO EACH OTHER

(75) Inventors: Man Chung Ng, Kwai Chung (CN); Wai Lik Chan, Kwai Chung (CN); Kwok Kei Wong, Kwai Chung (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 77 days.

(21) Appl. No.: 13/323,478

(22) Filed: Dec. 12, 2011

(65) Prior Publication Data

US 2013/0149839 A1   Jun. 13, 2013

(51) Int. Cl.
  *B32B 39/00*   (2006.01)

(52) U.S. Cl.
  USPC ........... 156/538; 156/539; 438/455; 198/363; 198/427; 198/433

(58) Field of Classification Search
  USPC ........... 156/538, 539; 438/455; 257/E21.211; 198/363, 427, 433; 414/285
  See application file for complete search history.

(56) References Cited

U.S. PATENT DOCUMENTS

| | | | | |
|---|---|---|---|---|
| 3,429,416 | A * | 2/1969 | Provost et al. | 198/433 |
| 5,318,165 | A * | 6/1994 | Spatafora et al. | 198/433 |
| 5,381,884 | A * | 1/1995 | Spatafora et al. | 198/433 |
| 6,566,278 | B1 * | 5/2003 | Harvey et al. | 438/778 |
| 2004/0244915 | A1 * | 12/2004 | Lam et al. | 156/510 |
| 2007/0281496 | A1 * | 12/2007 | Ingle et al. | 438/778 |
| 2009/0178751 | A1 * | 7/2009 | Presley et al. | 156/60 |

* cited by examiner

*Primary Examiner* — George Koch
(74) *Attorney, Agent, or Firm* — Sughrue Mion, PLLC

(57) ABSTRACT

An apparatus for bonding at least two substrates to each other comprises a plurality of substrate bonding machines arranged adjacent to one another and an input transporter extending adjacent to the plurality of substrate bonding machines which is operative to deliver the substrates to each of the substrate bonding machines. The input transporter is supplied with substrates by an onloading station. An output transporter extending adjacent to the plurality of substrate bonding machines is operative to receive bonded substrates from each of the substrate bonding machines and deliver the bonded substrates to an offloading station for removal from the apparatus.

6 Claims, 16 Drawing Sheets

Load substrates

APPARATUS FOR BONDING SUBSTRATES TO EACH OTHER

FIELD OF THE INVENTION

The invention relates to the bonding of two substrates to each other, and in particular to the bonding of substrates in the form of flat panels.

BACKGROUND AND PRIOR ART

There are various applications in the semiconductor industry where two substrates in the form of flat panels have to be bonded together. Typically, at least one of the panels would be made of glass. For instance, for touch-screen display panels, two glass panels may have to be bonded together. Another common application is where a protective glass layer is bonded onto a semiconductor wafer in the making of solar panels. An adhesive such as epoxy is typically used to seal the two substrate panels together for downstream processing.

Until now, most substrate bonding machines for conducting substrate-bonding processes are at best semi-automatic in that the loading and unloading of panels are handled manually even if the actual bonding operation is automated. In order to bond two substrates together, an operator is required to load a pair of substrates one at a time into the substrate bonding machine. The machine will perform the bonding process automatically, which typically includes providing an adhesive substance onto a mating surface of one of the substrates, bonding the other substrate onto the mating surface of the first-mentioned substrate and then curing the adhesive. Lastly, the bonded substrates will be manually offloaded and removed from the panel-bonding machine. The panel-bonding machine may not be able to perform bonding during such manual loading and unloading, thereby interrupting the production process and adversely affecting the throughput.

In order to increase the throughput, one approach is to add extra substrate bonding machine lines as illustrated in FIG. 1, which is a schematic layout of a prior art bonding apparatus 100 comprising multiple substrate bonding machines. The machines are arranged next to each other in a row. Each machine comprises a work station 102 where a pair of substrates 104, 104' is bonded together using an adhesive, such as epoxy. The substrates 104, 104' are manually loaded onto a substrates supply device 106, which then feeds the substrates 104, 104' to an input feeder 108 of the work station. After bonding, the bonded substrates, in the form of laminated substrates 110, are individually offloaded from the work station 102. Therefore, loading of substrates 104, 104' occur at multiple locations to feed the substrates 104, 104' in parallel into the work stations 102, and offloading of laminated substrates 110 also occurs at multiple locations in parallel.

Using this approach, besides the increase in cost, more space is required to accommodate the extra transport systems of all the machines. Further, extra manpower is required for loading and unloading the substrates at the multiple onloading and offloading locations of the different machines.

SUMMARY OF THE INVENTION

It is thus an object of the invention to seek to provide a bonding apparatus for bonding substrates which automatically loads and unloads substrates to and from substrate bonding machines, and which improves throughput at a reduced cost as compared to conventional substrate bonding apparatus.

According to a first aspect of the invention, there is provided an apparatus for bonding at least two substrates to each other, comprising: a plurality of substrate bonding machines arranged adjacent to one another; an input transporter extending adjacent to the plurality of substrate bonding machines which is operative to deliver the substrates to each of the substrate bonding machines; an onloading station for supplying substrates to the input transporter; an output transporter extending adjacent to the plurality of substrate bonding machines which is operative to receive bonded substrates from each of the substrate bonding machines; and an offloading station which receives bonded substrates from the output transporter.

According to a second aspect of the invention, there is provided a method for bonding at least two substrates to each other, comprising the steps of: arranging a plurality of substrate bonding machines adjacent to one another; transferring substrates from an onloading station to an input transporter extending adjacent to the plurality of substrate bonding machines; delivering substrates located on the input transporter to each of the plurality of substrate bonding machines; bonding at least two of the substrates to each other at each of the substrate bonding machines; transferring bonded substrates from the substrate bonding machines to an output transporter extending adjacent to the plurality of substrate bonding machines; and thereafter delivering substrates located on the output transporter to an offloading station.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus for bonding substrates in accordance with the invention will now be described with reference to the accompanying drawings, in which:

FIGS. 7a to 7e illustrate an exemplary transportation sequence for transporting substrates between the two adjacent transport devices as shown in FIG. 6a.

DETAILED DESCRIPTION OF THE PREFERRED EMBODIMENT OF THE INVENTION

Figure 1:
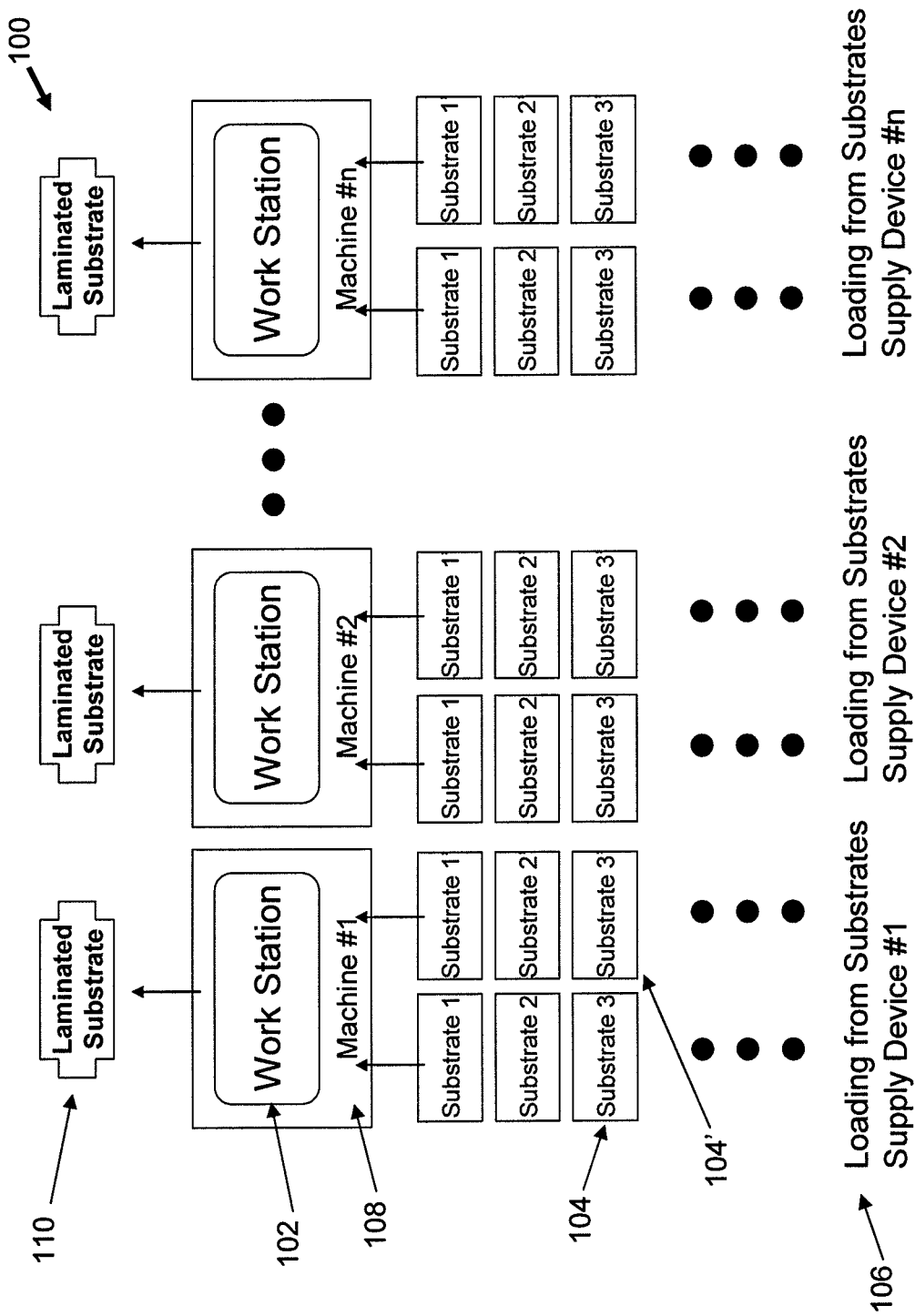
FIG. 1 is a schematic layout of a prior art bonding apparatus comprising multiple substrate bonding machines.
Figure 2:
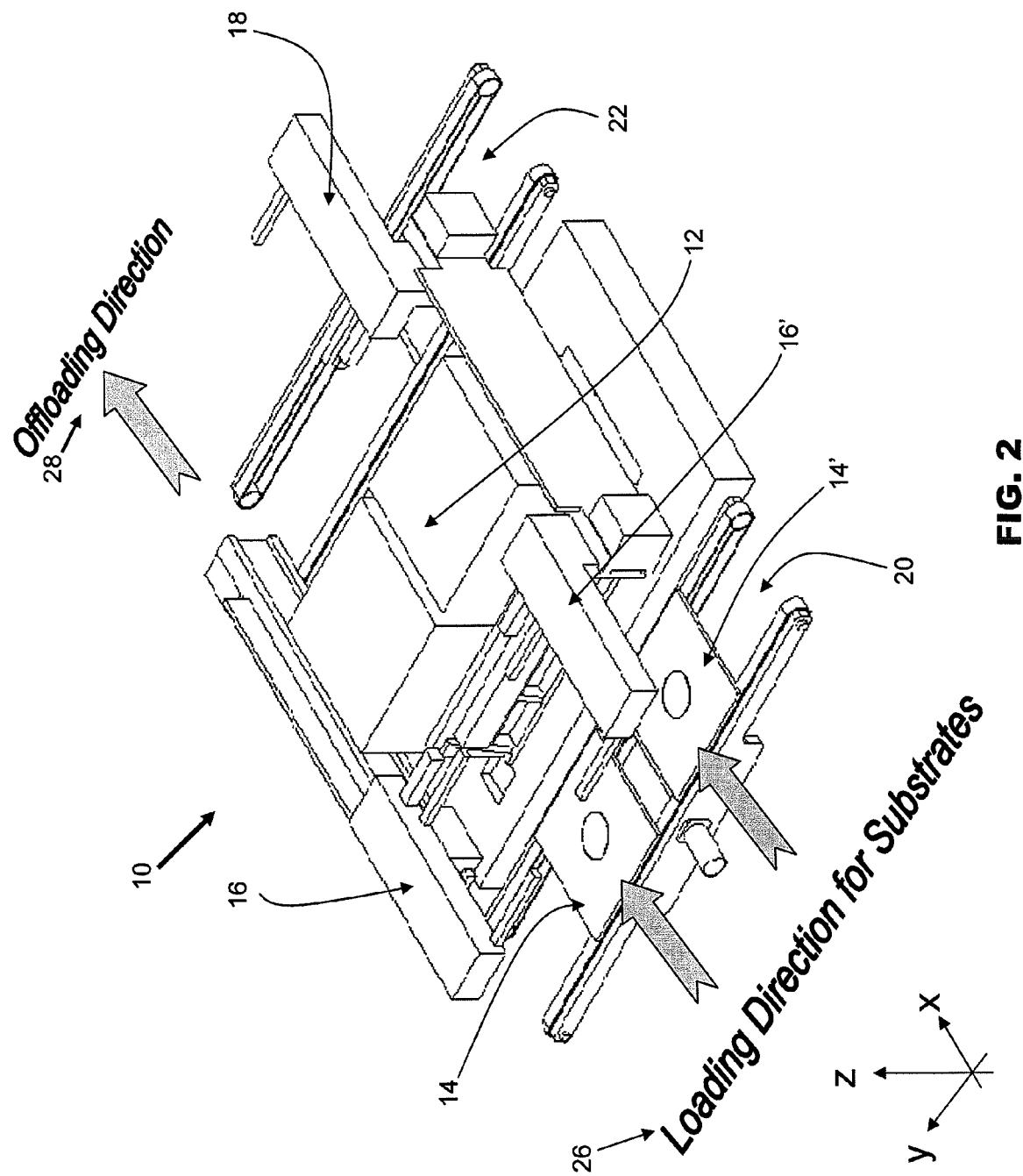
FIG. 2 is an isometric view of a substrate bonding machine according to the preferred embodiment of the invention.

FIG. 2 is an isometric view of a substrate bonding machine 10 according to the preferred embodiment of the invention. The substrate bonding machine 10 has a work station 12 where at least a pair of substrates 14, 14' is bonded together in an automated process. First, substrates 14, 14' are automatically loaded onto an input transport device 20 from an onloading station including a supply of substrates 26, such as a magazine (not shown) which stores a plurality of substrates 14, 14' for automated feeding to the input transport device 20. A pair of input transfer arms 16, 16' respectively grip onto the pair of substrates 14, 14' and transport them to the work station 12 adjacent to the input transport device 20 for bonding.

After the substrates 14, 14' have been bonded together, an output transfer arm 18 removes the bonded substrate from the work station 12 onto an output transport device 22 adjacent to the work station 12 for removal of the bonded substrate from the substrate bonding machine 10.

Figure 3:
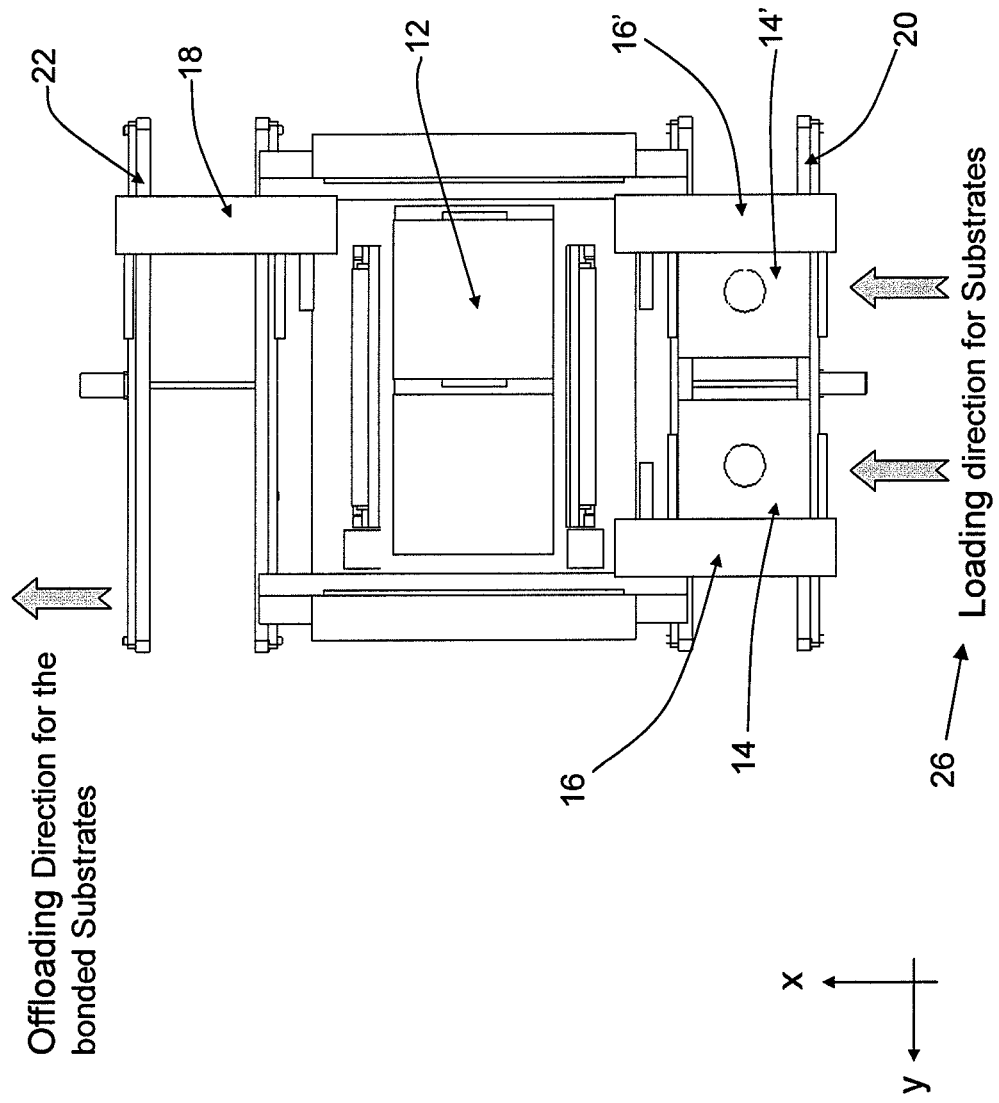
FIG. 3 is a plan view of the substrate bonding machine of FIG. 2.

FIG. 3 is a plan view of the substrate bonding machine of FIG. 2. Pairs of substrates 14, 14' are automatically loaded onto the input transport device 20 from a supply of substrates 26. The pair of input transfer arms 16, 16' respectively grip onto the pair of substrates 14, 14' and transport them to the work station 12 for bonding.

After the substrates 14, 14' have been bonded together at the work station 12, an output transfer arm 18 removes the bonded substrate from the work station onto an output transport device 22 for removal from the substrate bonding machine 10.

Figure 4:
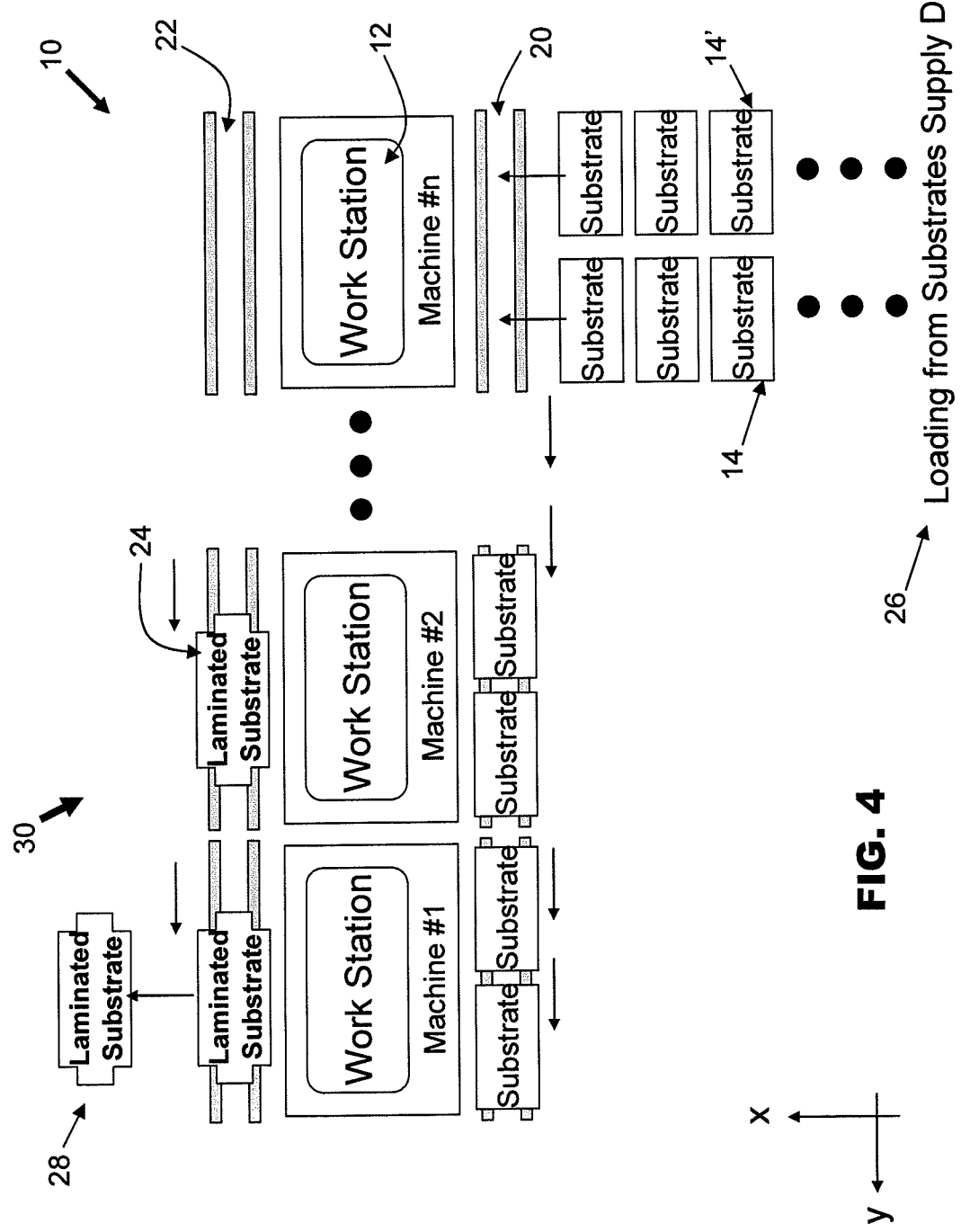
FIG. 4 is a schematic layout of a bonding apparatus according to the preferred embodiment of the invention comprising a plurality of substrate bonding machines.

FIG. 4 is a schematic layout of a bonding apparatus 30 according to the preferred embodiment of the invention comprising a plurality of substrate bonding machines 10. A plurality of substrate bonding machines 10 are arranged next to each other in a row. An input transporter is comprised of a plurality of the input transfer devices 20 and extends adjacent to the plurality of substrate bonding machines 10 to deliver the substrates 14, 14' to each of the substrate bonding machines 10. The input transport device 20 of each substrate bonding machine 10 is operationally connected to that of another substrate bonding machine such that substrates 14, 14' may be transferred along the respective input transport devices 20 of the input transporter from one substrate bonding machine 10 to another.

Substrates 14, 14' are continuously supplied from the substrates supply device 26 in pairs to the input transport device 20, and the substrates 14, 14' may be further transferred downstream to other substrate bonding machines 10. After a work station 12 has bonded a pair of substrates 14, 14', the resulting laminated substrate 24 is transferred to an output transporter comprising a plurality of the output transport device 22 of the substrate bonding machine 10. The output transport device 22 of each substrate bonding machine 10 is also operationally connected to that of another substrate bonding machine such that laminated substrates 24 received from the work stations 12 can be conveyed downstream along the output transport devices 22 of the output transporter to an offloading station 28 for removing the laminated substrates 24 from the apparatus 30.

It would be observed that the input transporter comprising the plurality of input transport devices 20 and the output transporter comprising the plurality of output transport devices 22 are located on opposite sides of the plurality of substrate bonding machines 10. In the preferred embodiment, the onloading and offloading stations are each beneficially situated at a single location for consolidating the feeding of unbonded substrates 14, 14' and the removal of bonded substrates respectively.

Figure 5A:
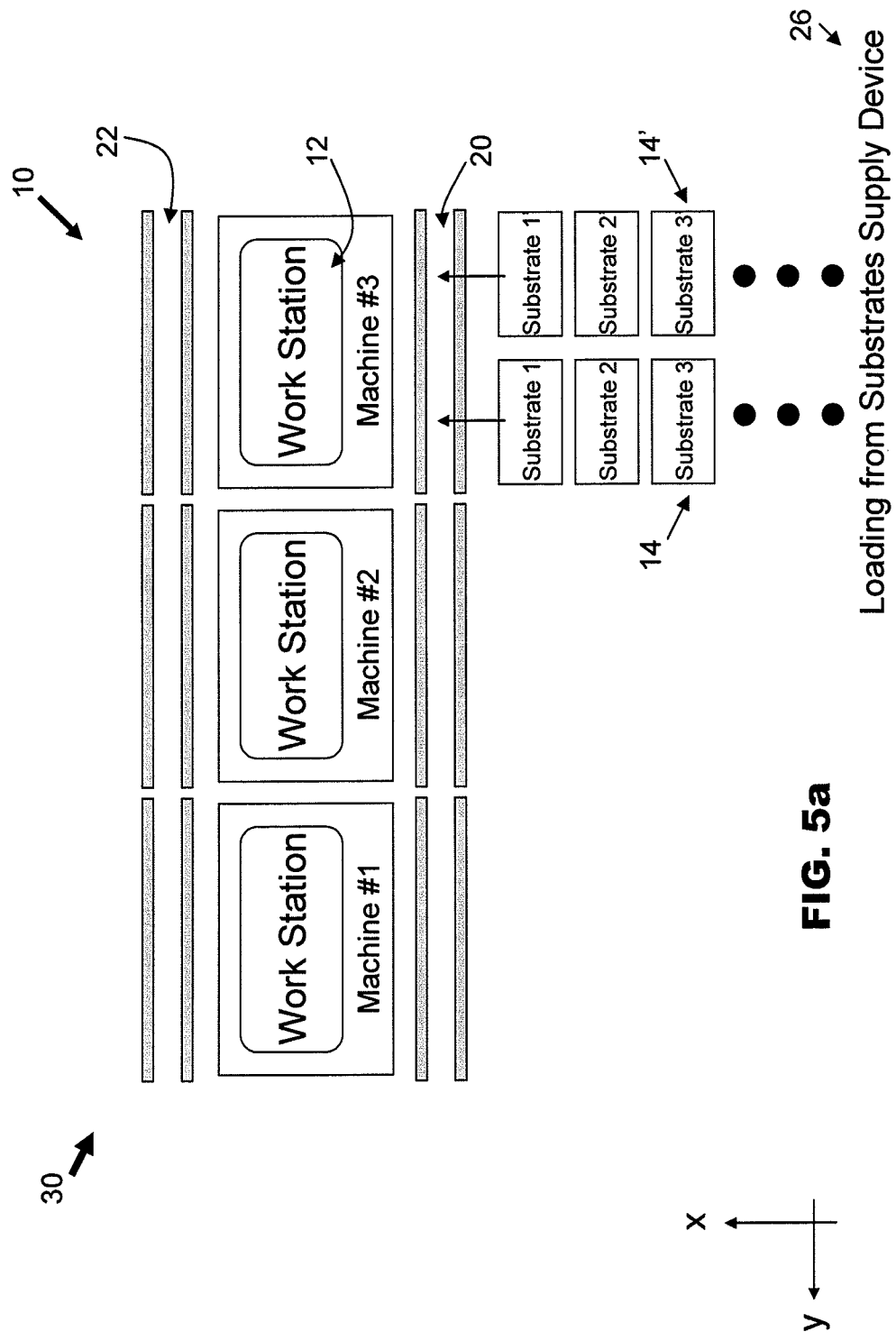
FIGS. 5a-5j demonstrate an exemplary motion sequence for transferring substrates for bonding by a bonding apparatus comprising three substrate bonding machines.
Figure 5B:
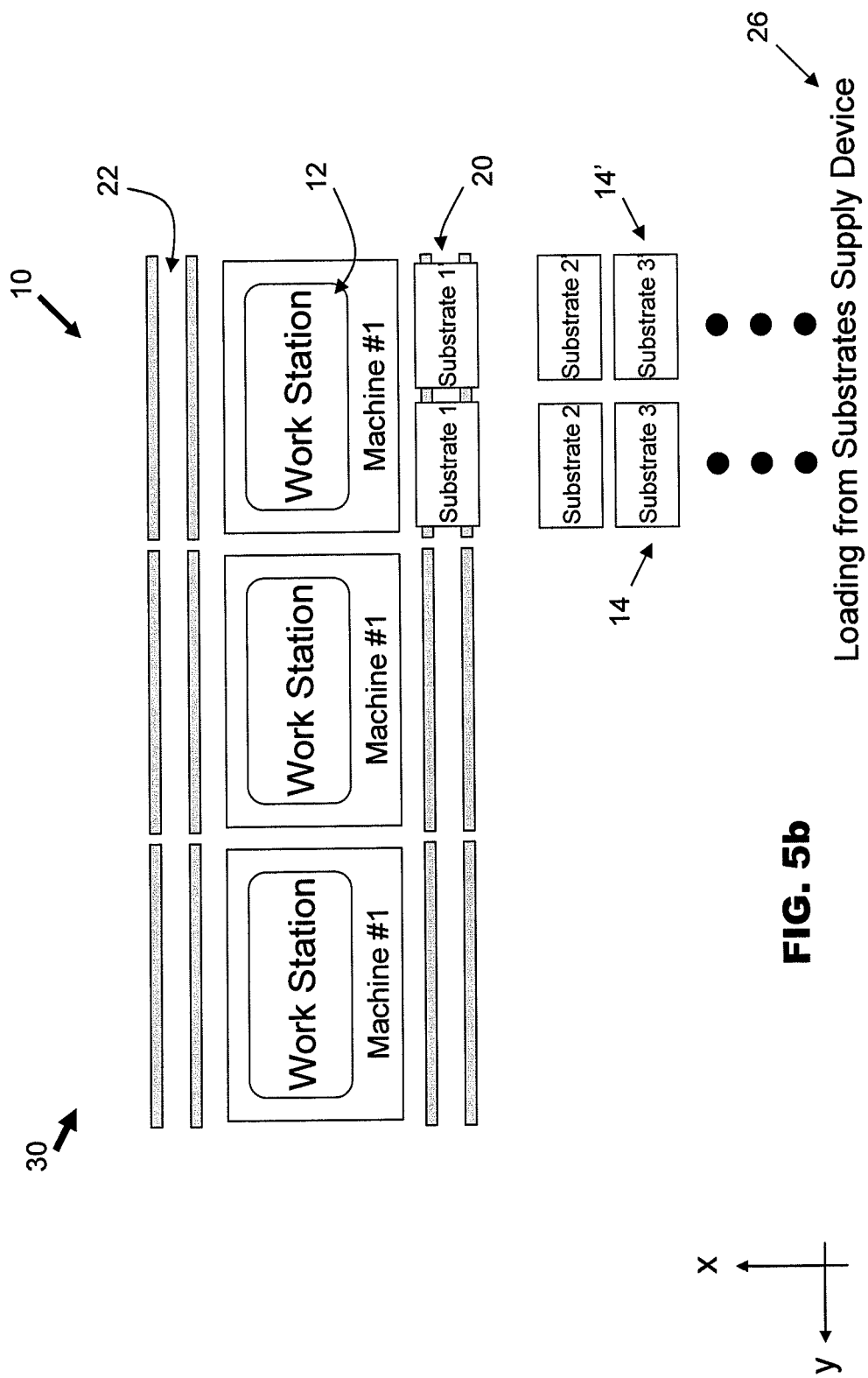

FIGS. 5a-5j demonstrate an exemplary motion sequence for transferring substrates for bonding by a bonding apparatus 30 comprising three substrate bonding machines 10. In FIG. 5a, pairs of substrates 14, 14' are being fed towards an input transport device 20. In FIG. 5b, a first pair of substrates 14, 14' is positioned onto the input transport device 20 of a first substrate bonding machine 10.

Figure 5C:
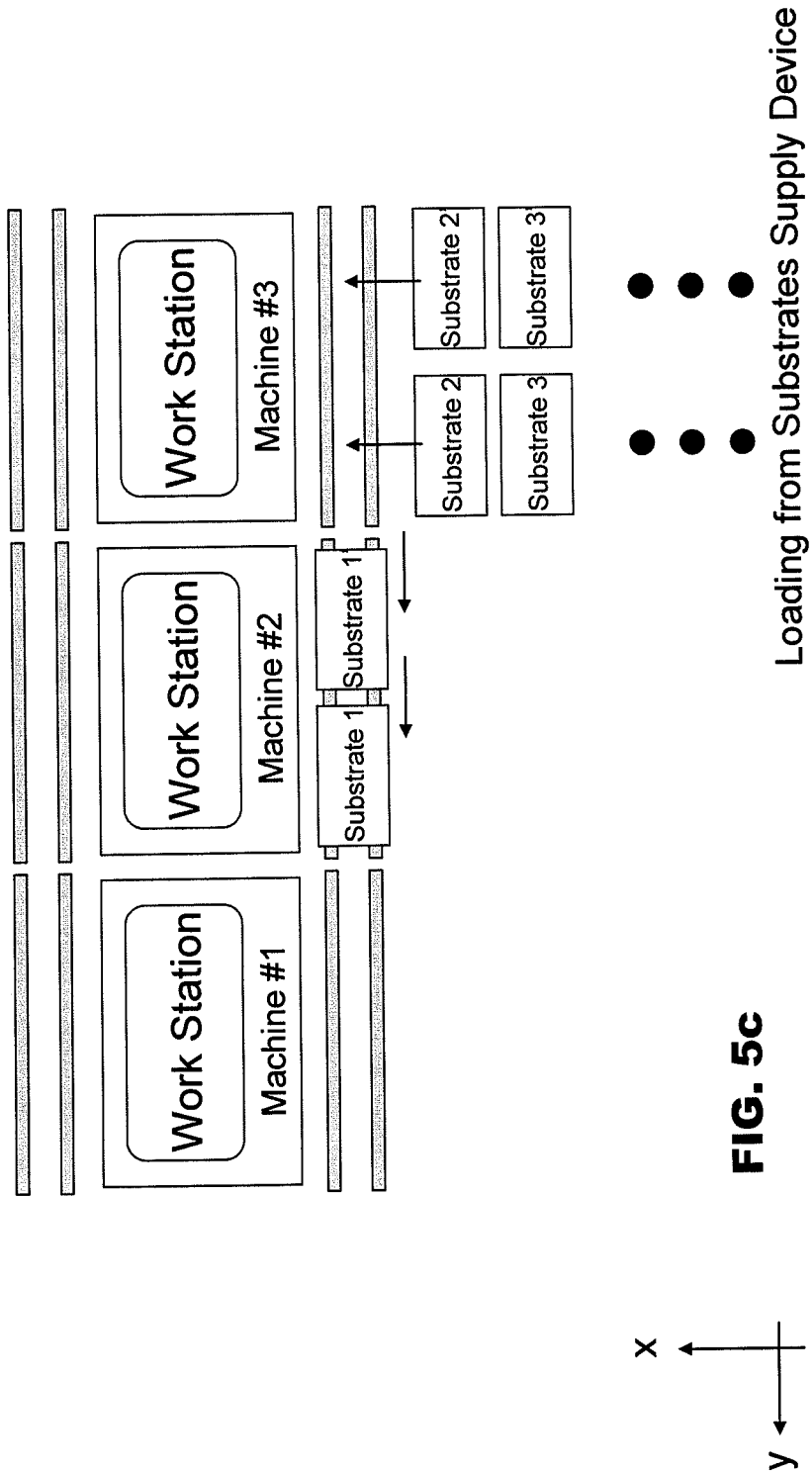
Figure 5D:
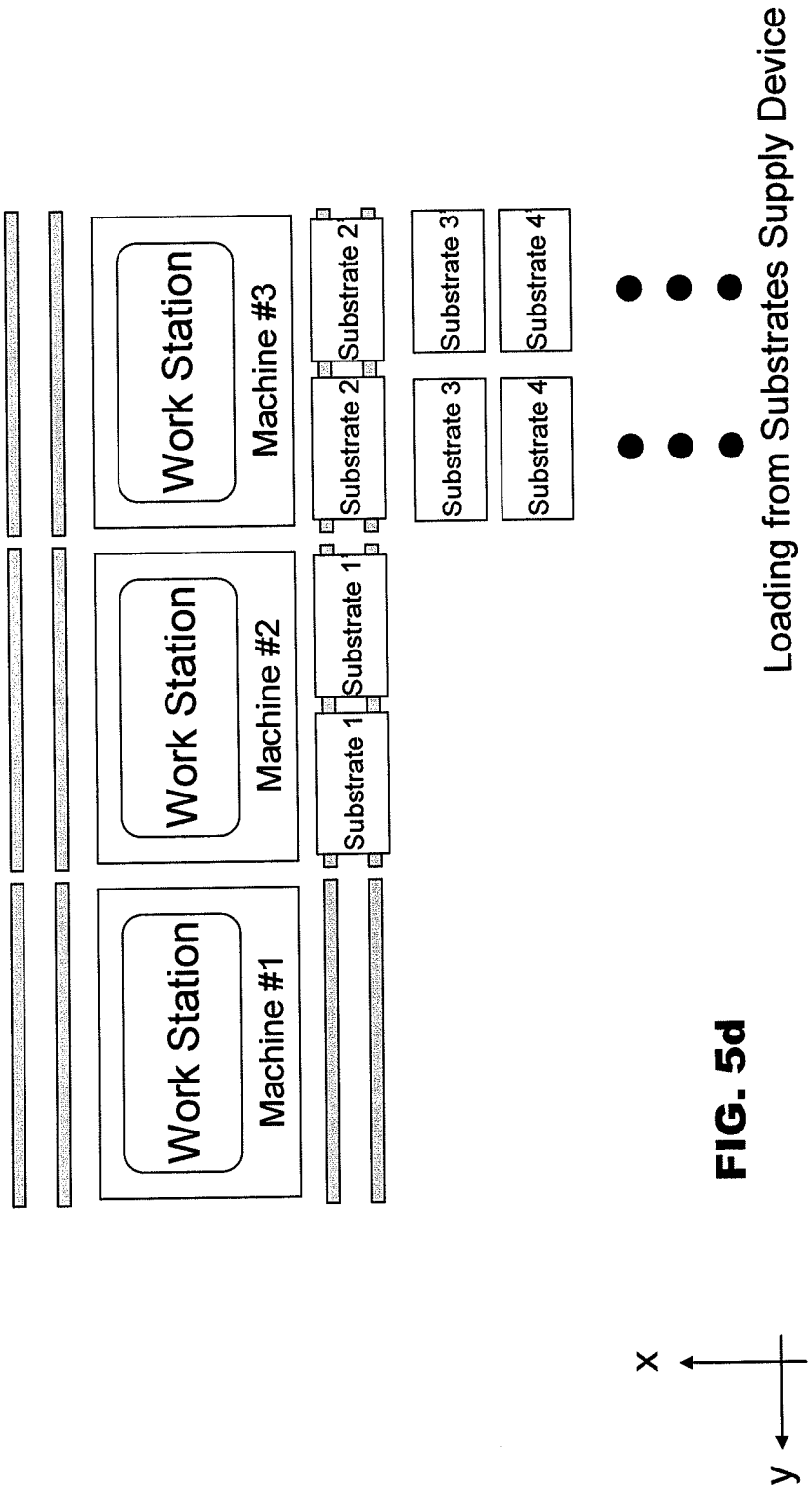

In FIG. 5c, instead of transferring the pair of substrates 14, 14' directly onto the work station 12 of the first substrate bonding device 10, the substrates are transported along the input transport device 20 to the input transport device of an adjacent substrate bonding machine 10. Meanwhile, in FIG. 5d, another pair of substrates 14, 14' is moved into the space on the first input transport device 20 which has now been vacated.

Figure 5E:
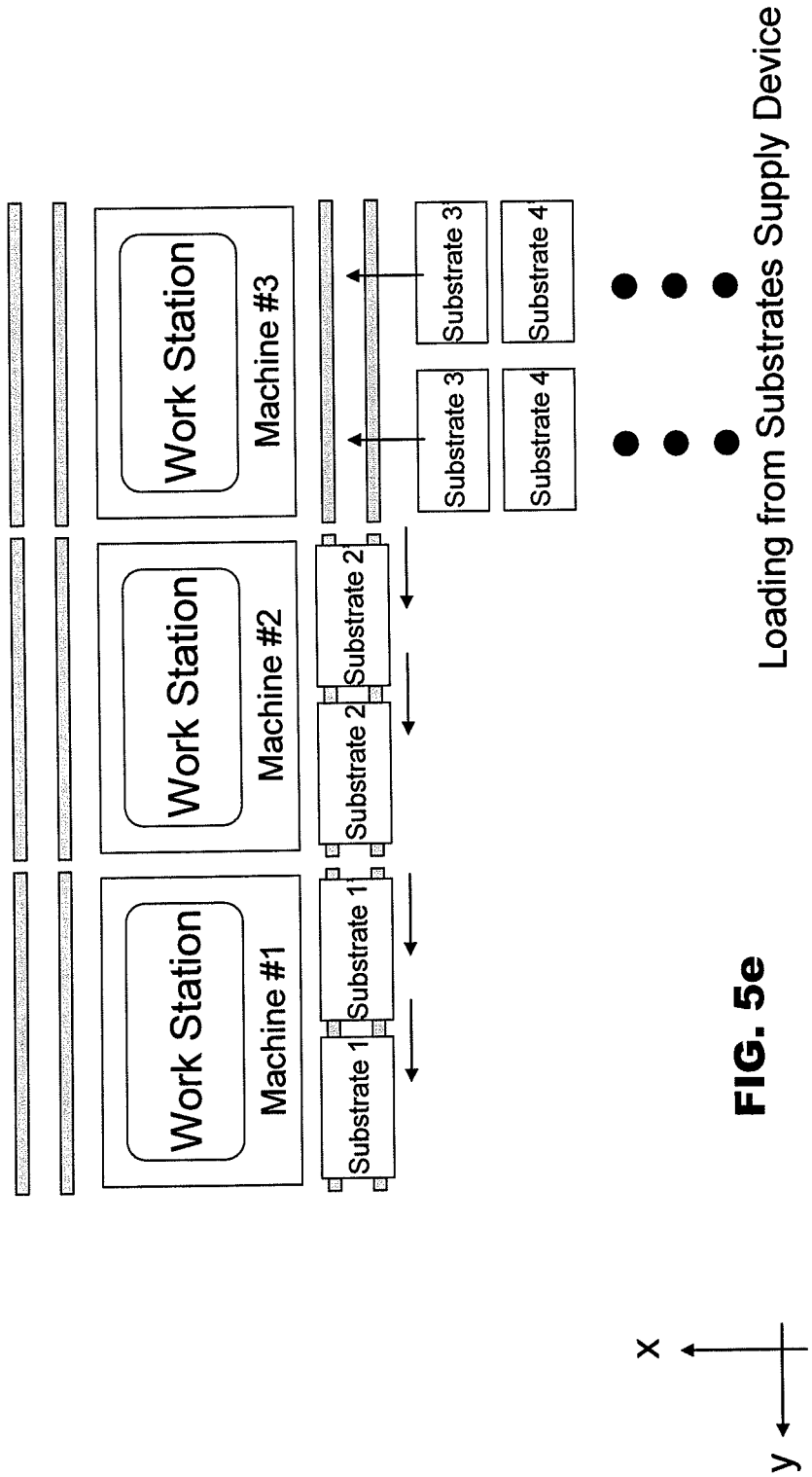
Figure 5F:
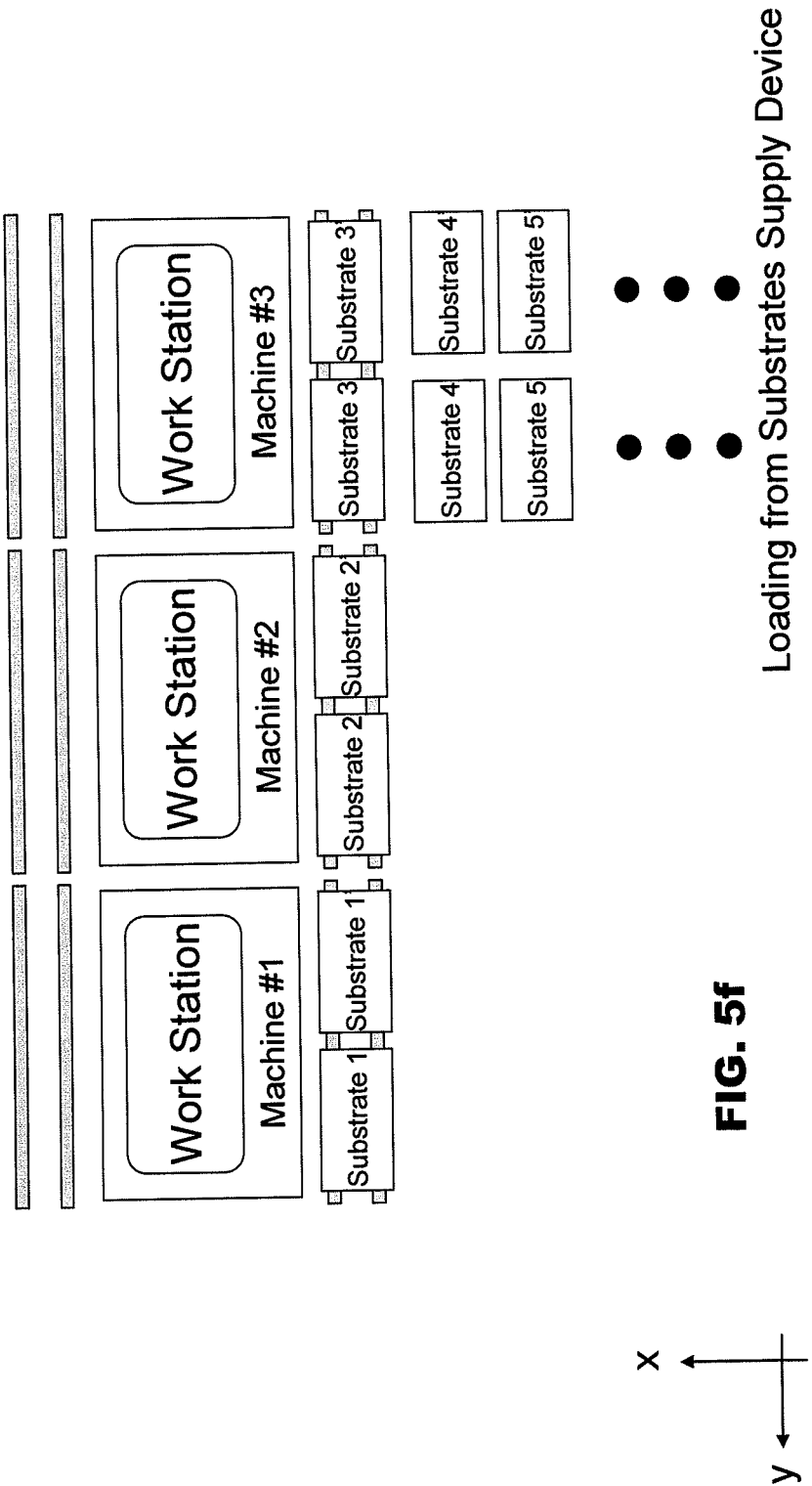
Figure 5G:
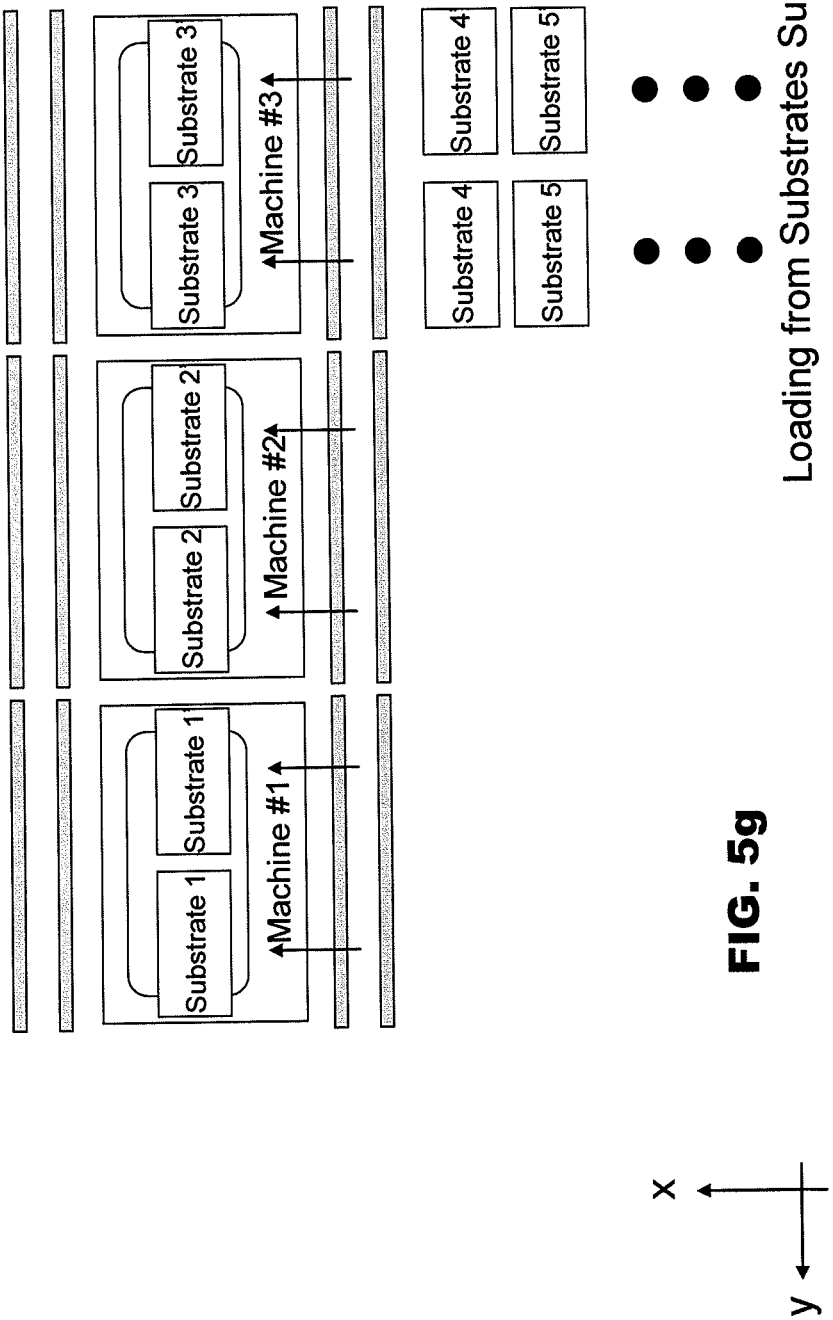
Figure 5H:
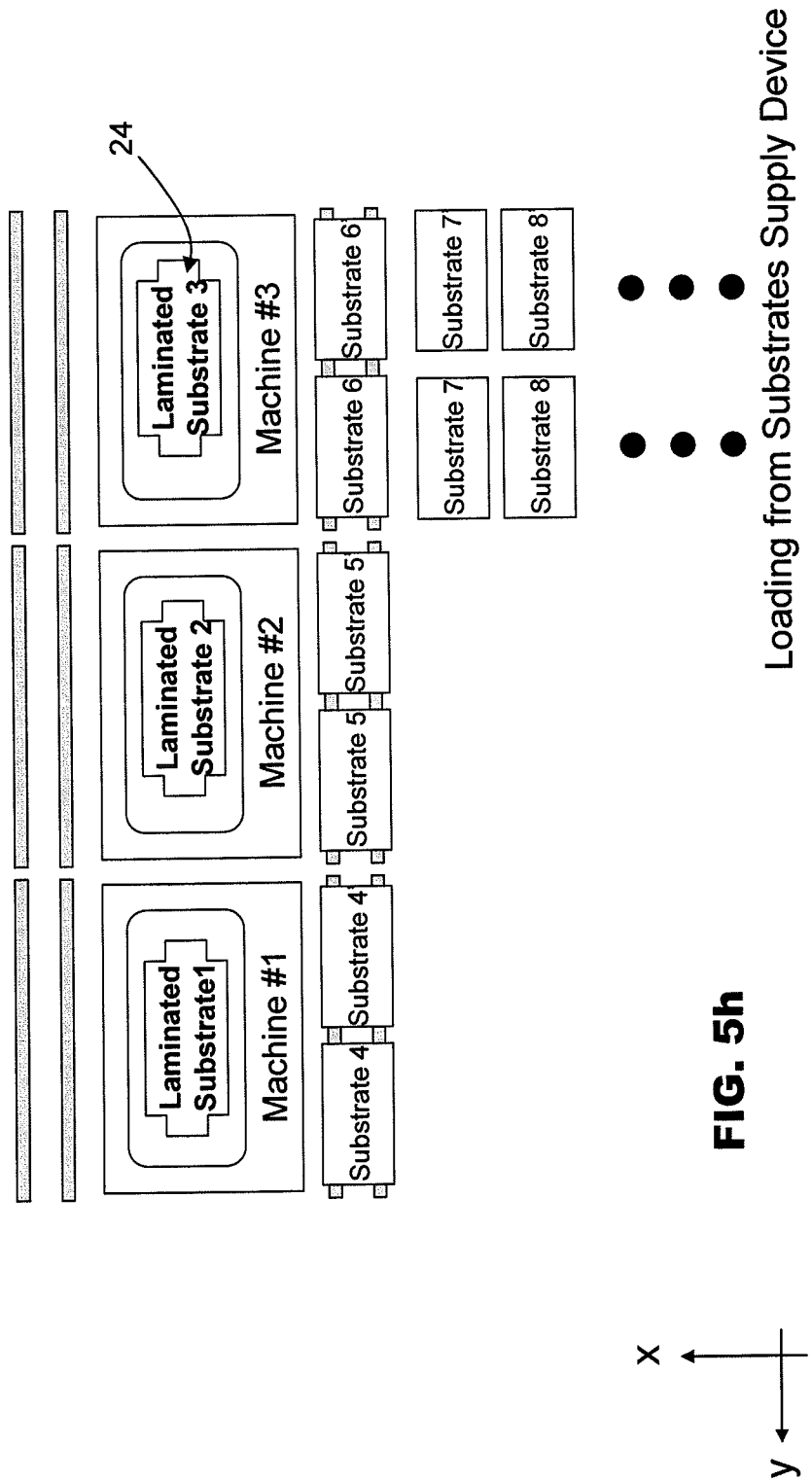

It is preferred that the first pair of substrates 14, 14' is transported along the input transport devices downstream until the first pair of substrates 14, 14' arrives at the input transport device 20 of a left-most substrate bonding machine 10 at the end of the row, which is furthest away from the onloading station. Subsequently, substrate bonding machines nearer to the onloading station receive substrates 14, 14'. As illustrated in FIG. 5e and FIG. 5f, adjacent pairs of substrates 14, 14' are transported downstream successively until all the input transport devices 20 have been filled up. Then, the respective pairs of substrates 14, 14' are transferred to the work stations 12 substantially simultaneously for the substrates to be bonded together as shown in FIG. 5g. In FIG. 5h, the respective pairs of substrates 14, 14' have been bonded together to form laminated substrates 24.

Figure 5I:
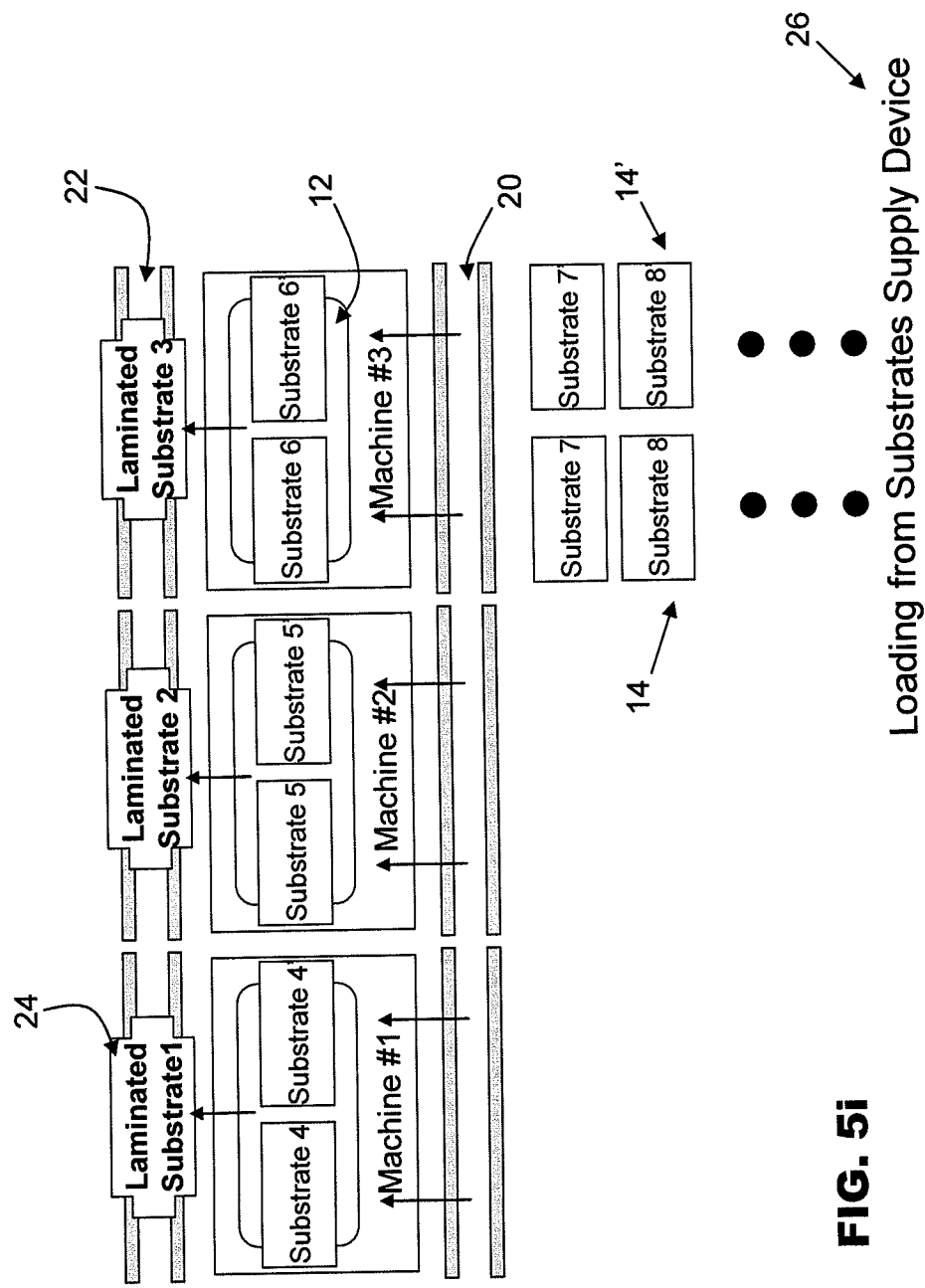

Meanwhile, as the substrates 14, 14' are being bonded together to form laminated substrates 24, further pairs of substrates are being supplied to the input transport devices 20 and the further substrates are moved downstream until all the input transport devices 20 of the row of substrate bonding machines 10 are again filled up, as seen in FIG. 5h. In FIG. 5i, the laminated substrates 24 are then transferred to the output transport devices 22 substantially simultaneously, while unbonded substrates 14, 14' are transferred to the work stations 12 to replace the laminated substrates 24 which have been transferred to the output transport devices 22.

Figure 5J:
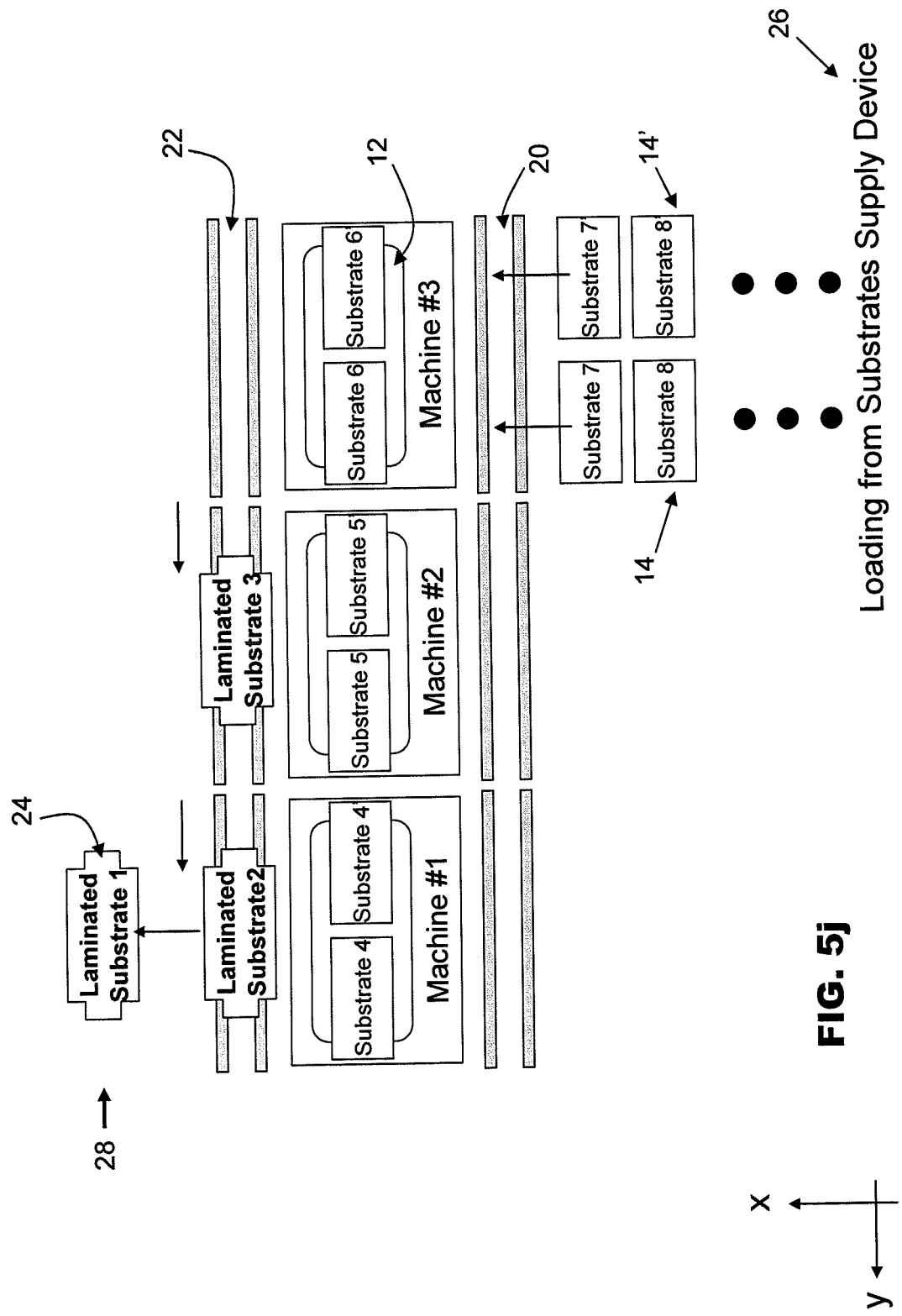

In FIG. 5j, the laminated substrates 24 are sequentially transported to the end of the row of substrate bonding machines 10 where an offloading station 28 is situated. Upon reaching the last substrate bonding machine 10, each laminated substrate 24 is transferred to the offloading station 28 to be automatically removed from the apparatus. After removal thereof, newly laminated substrates 24 are transferred to the output transport devices 22. Unbonded pairs of substrates 14, 14' are in turn transferred to the input transport devices 20 and then to the work stations 12. The aforesaid bonding cycles are repeated until all the substrates 14, 14' provided at the substrates supply device 26 have been bonded.

It should be noted that the input transport devices 20 and output transport devices 22 may comprise any form of transportation device, such as conveyor belts, walking beams or indexing clamps, so long as such transportation device is operable to transport substrates 14, 14' to adjacent substrate bonding machines 10.

Figure 6A:
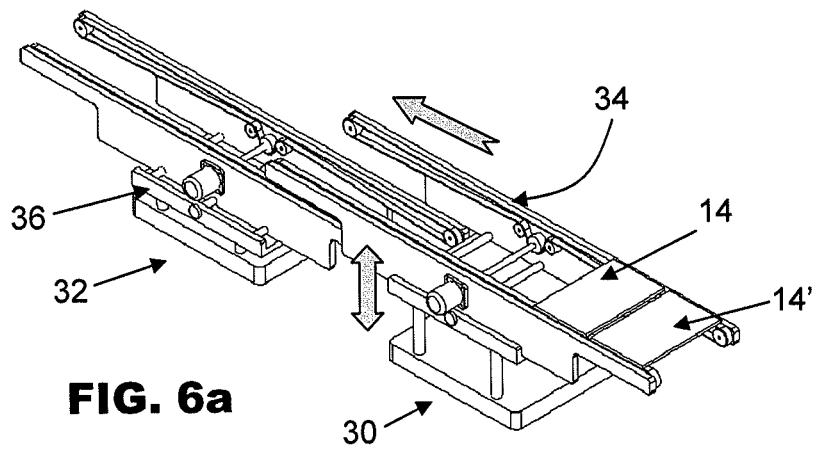
FIGS. 6a and 6b are isometric and plan views respectively of two adjacent transport devices for transporting substrates to different substrate bonding machines for bonding.
Figure 6B:
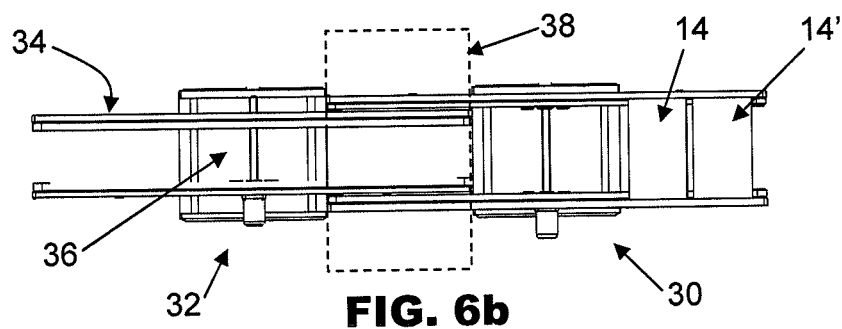

FIGS. 6a and 6b are isometric and plan views respectively of two adjacent transport devices 30, 32 for transporting substrates 14, 14' to different substrate bonding machines for bonding. For simplicity, only first and second transport devices 30, 32 for two substrate bonding machines 10 are shown. Both the input transport devices 20 and output transport devices 22 may have similar layouts. Each transport device 30, 32 comprises a conveying mechanism, such as conveyor belts 34, which is coupled to a vertical positioning table 36 driven by associated actuators. Hence, the substrates 14, 14' can be transported in the X-axis (horizontally) by the conveyor belts 34 and in the Z-axis (vertically) to different heights by the vertical positioning tables 36 moving the conveyor belts 34 vertically. In the embodiment shown in FIGS. 6a and 6b, conveyor belts 34 are used as an example of the driving or conveying mechanism for transporting substrates within each of the transport devices 30, 32 only. However, a single conveyor belt system is equally applicable for use as a transportation mechanism between separate substrate bonding machines 10.

Figure 7A:
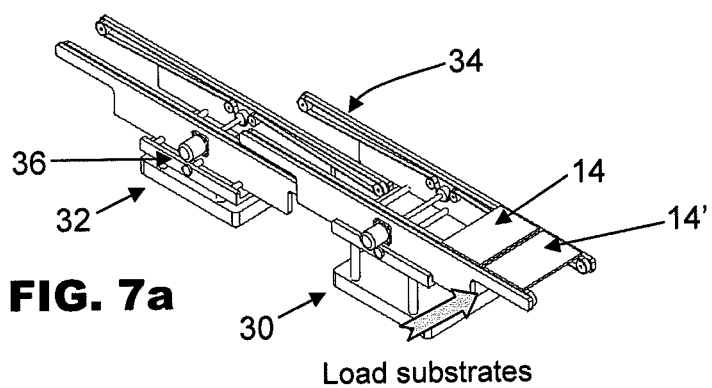
Figure 7B:
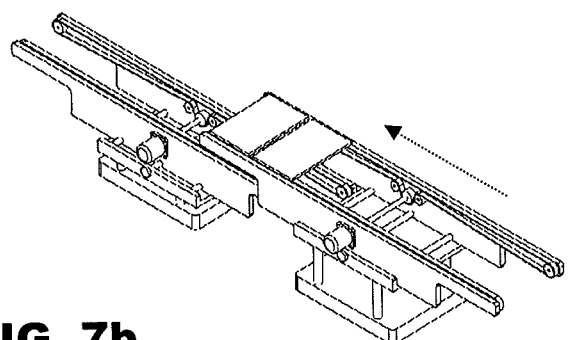
Figure 7C:
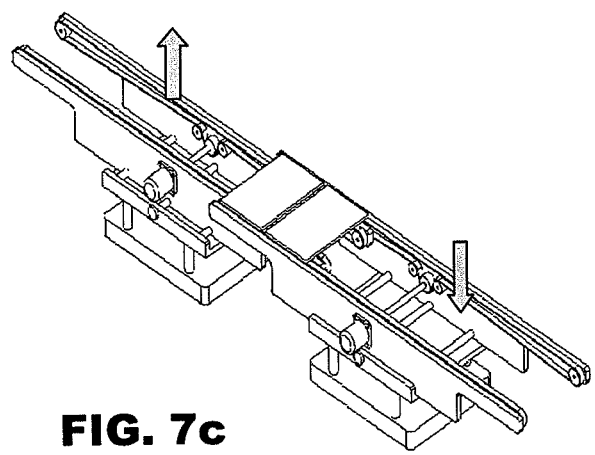

FIGS. 7a to 7e illustrate an exemplary transportation sequence for transporting substrates 14, 14' between the two adjacent transport devices 30, 32 as shown in FIG. 6a. In FIG. 7a, two substrates 14, 14' are loaded onto the first transport device 30. The conveyor belts 34 of the first input transport device 30 will carry the substrates 14, 14' along a conveying axis to a common region or common zone 38 where the conveying system 20 of the second transport device 32 is positioned underneath it (see FIG. 7b). The conveyor belts 34 of the first and second input transport devices 30, 32 overlap along the conveying axis at the common zone 38. The conveyor belts 34 of the first transport device 30 will then descend while the conveyor belts 34 of the second input transport device 32 will ascend utilizing the respective vertical positioning tables 36 as shown in FIG. 7c.

Figure 7D:
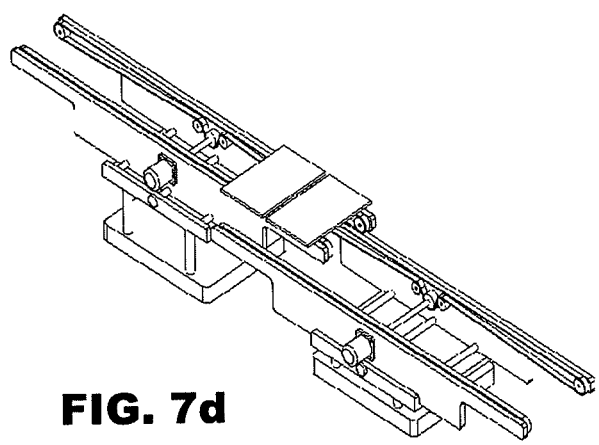
Figure 7E:
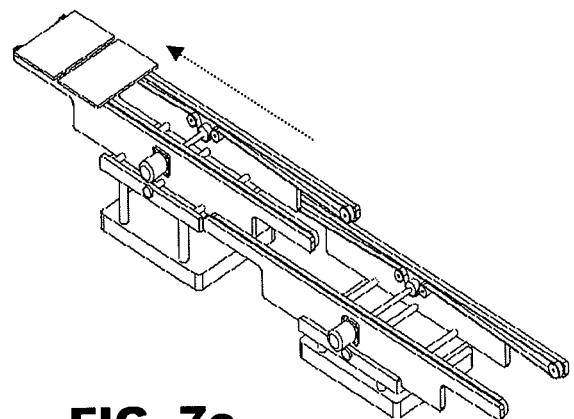

The substrates 14, 14' on the conveyor belts 34 of the first transport device 30 will be picked up and transported by the conveying belts 34 of the second input transport device 32 (see FIG. 7d and FIG. 7e). Once the substrates 14, 14' leave the common region 38, the conveyor belts 34 of the first transport device 30 will ascend to its original height for loading new substrates. With this handover method, substrates 14, 14' can be carried from a single supply of substrates 26 to the different substrate bonding machines 10. Transfer arms 16, 16', 18 load the substrates 14, 14' from the input transport devices 20 to the work stations 12, and unload the bonded substrates from the work holders 12 to the output transport devices 22.

It would be appreciated that the apparatus 30 according to the preferred embodiment of the invention is of modular construction and is sufficiently flexible to change the number of substrate bonding machines 10 in a cascading processing line in order to increase the production throughput. Since there is only one loading location where the substrate supply device 26 is situated and one offloading location where the offloading station 28 is situated, an area of production floor required to install the apparatus can be reduced and the cost may also be correspondingly reduced.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for bonding at least two substrates to each other, comprising:
   a plurality of substrate bonding machines arranged adjacent to one another;
   an input transporter extending adjacent to the plurality of substrate bonding machines which is operative to deliver the substrates to each of the substrate bonding machines;
   an onloading station for supplying substrates to the input transporter;
   an output transporter extending adjacent to the plurality of substrate bonding machines which is operative to receive bonded substrates from each of the substrate bonding machines; and
   an offloading station which receives bonded substrates from the output transporter,
   wherein the input transporter comprises a first input transport device adjacent to a first substrate bonding machine and a second input transport device adjacent to a second substrate bonding machine,
   wherein the first input transport device are configured to transport the substrates located on it to the second input transport device,
   wherein the first and second transport devices each includes a conveyor mechanism coupled to a vertical positioning table, the vertical positioning table being operative to move the conveyor mechanism to different heights the first and second input transport devices being operable to transport the substrates along a conveying axis, and
   wherein the first and second input transport devices overlap each other along the conveying axis at a common region, and one of the first and second input transport devices is operable to effect a motion relative to the respective other of the first and second input transport devices to transfer the substrates at the common region from the first input transport device to the second input transport device.

2. The apparatus as claimed in claim 1, wherein the input transporter and the output transporter are located on opposite sides of the plurality of substrate bonding machines.

3. The apparatus as claimed in claim 1, wherein the conveyor mechanisms comprise conveyor belts.

4. The apparatus as claimed in claim 1, wherein the output transporter comprises a first output transport device adjacent to a first substrate bonding machine and a second output transport device adjacent to a second substrate bonding machine, the first output transport device being configured to transport the substrates located on it to the second output transport device.

5. The apparatus as claimed in claim 1, further comprising:
   input transfer arms which are operative to grip the substrates and to transfer the substrates from the input transporter to a work station of the substrate bonding machine; and
   output transfer arms which are operative to grip the substrates and to transfer the substrates from the work station to the output transporter.

6. The apparatus as claimed in claim 1, wherein the onloading station is situated at a single location for feeding substrates to the input transporter and the offloading station is situated at a single location for receiving bonded substrates from the output transporter.

* * * * *